United States Patent [19]
Park et al.

[11] Patent Number: 5,880,484
[45] Date of Patent: Mar. 9, 1999

[54] LATERAL RESONANT TUNNELING TRANSISTOR HAVING TWO NON-SYMMETRIC QUANTUM DOTS

[75] Inventors: Kyoung-Wan Park, Daejeon; Seong-Jae Lee, Seoul; Min-Cheol Shin, Daejeon, all of Rep. of Korea

[73] Assignee: Electronics and Telecommunications Research Institute, Daejeon, Rep. of Korea

[21] Appl. No.: 706,238

[22] Filed: Sep. 4, 1996

[30] Foreign Application Priority Data

Dec. 22, 1995 [KR] Rep. of Korea ............... 95-54535

[51] Int. Cl.[6] .................................................. H01L 29/06
[52] U.S. Cl. ...................................... 257/25; 257/194
[58] Field of Search ............................ 257/25, 194, 24

[56] References Cited

U.S. PATENT DOCUMENTS

| | | | |
|---|---|---|---|
| 4,672,423 | 6/1987 | Fowler et al. | 357/23.3 |
| 4,962,410 | 10/1990 | Kriman et al. | 357/22 |
| 5,285,081 | 2/1994 | Ando | 257/24 |
| 5,485,018 | 1/1996 | Ogawa et al. | 257/24 |

OTHER PUBLICATIONS van Houten, et al., Coulomb–Blockade Oscillations in Quantum Wire and Dots, Springer Series in Electronics and Photonics, vol. 31, Single–Electron Tunneling and Mesoscopic Devices, pp. 159–169 (1992).

*Primary Examiner*—Sara Crane
*Attorney, Agent, or Firm*—Nixon & Vanderhye, P.C.

[57] ABSTRACT

A lateral resonant tunneling transistor having two non-symmetric quantum dots is disclosed. When a negative voltage is supplied to each plurality of thin split gates, two non-symmetric quantum dots are formed owing to the formation of the potential barrier. Thus when a forward bias voltage is applied, the resonant tunneling phenomena occur twice successively. Through these two successive resonant tunneling phenomena and by lowering the height of the third potential barrier $6a$, the resonant tunneling current can be maximized.

9 Claims, 4 Drawing Sheets

5,880,484

LATERAL RESONANT TUNNELING TRANSISTOR HAVING TWO NON-SYMMETRIC QUANTUM DOTS

BACKGROUND OF THE INVENTION

1. Field of the Invention

The present invention relates to a lateral resonant tunneling transistor having two non-symmetric quantum dots. In particular, the both of the ends of 2-dimensional electron gas (which is generated in a hetero-join structure of a compound semiconductor material) are provided respectively with terminals, and a plurality of split gates are formed in parallel above a channel through which the two dimensional electron gas passes.

2. Description of the Prior Art

The conventional transistors having the split gates are described in "Springer series in Electronics and Photonics" vol. 31, p 159–167, and in "Coulomb-Blockade Oscillations in Quantum Wires and Dots".

The above mentioned conventional transistor is constituted such that a plurality of split gates are arranged in a radiative form around a central point. Thus by providing a plurality of split gates and by supplying a negative voltage to the gates, a quantum dot is formed at the central point.

The current which is adjusted in the above described manner owes mainly to a resonant tunneling effect. That is, when the energy levels of the electrons of the opposite sides across a potential barrier correspond with each other, the electrons moves through the potential barrier.

For example, the resonant tunneling of electrons occurs in the following manner. That is, in the case where the region capable of accommodating electrons is divided into two portions across an electric potential barrier, when the energy levels of the electrons of the respective portions correspond with each other, the electrons of the energy level of one side moves through the electric potential barrier to the vacant energy level of the other side.

In such a resonant tunneling, the transmittance of the resonant tunneling depends on the height and thickness of the electric potential barrier.

The resonant tunneling phenomenon represents the negative differential resistance in the current-voltage characteristics.

In the conventional device utilizing the resonant tunneling phenomenon, there is the disadvantage that the adjustment of the current is difficult. The reason is that the adjustments of the quantum dots are difficult. Further, diversified current-voltage operation characteristics are difficult to obtain, with the result that the application range is very narrow.

SUMMARY OF THE INVENTION

The present invention is intended to overcome the above described disadvantages of the conventional techniques.

Therefore it is the object of the present invention to provide a lateral resonant tunneling transistor having two non-symmetric quantum dots, in which the adjustment of a resonant tunneling current is possible owing to a high negative differential resistance and owing to the adjustability of the gate voltages compared with the conventional techniques, and the voltages of the middle split gates can be adjusted so that the energy levels of the two quantum dots can be adjusted, and that diversified current-voltage operation characteristics for the transistor can be obtained.

In achieving the above object, the lateral resonant tunneling transistor having two non-symmetric quantum dots according to the present invention includes: a 2-dimensional electron gas layer formed by joining first and second semiconductor layers having mutually different materials; three split gates consisting of a plurality of gates arranged in parallel and isolated from one another; two gates, lying between first split gate and second split gate, and third split gate, the first gate having a narrow width between them, and the second gate having a wider width and disposed between the second and third split gates, whereby non-symmetric quantum dots are formed between the split gates of the first, the second, and the third.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
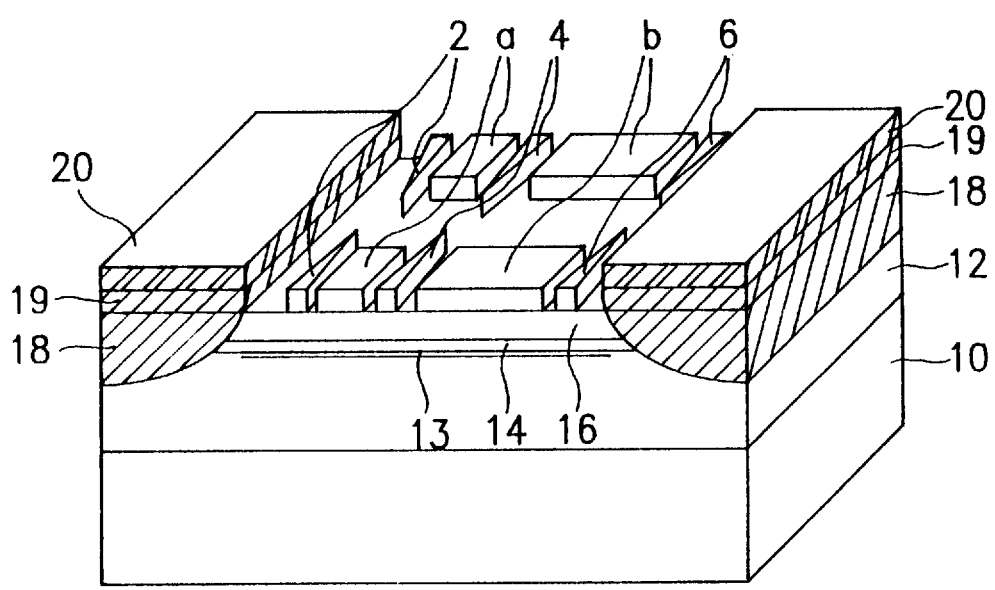
FIG. 1 is a perspective view of the lateral resonant tunneling transistor according to the present invention.

FIG. 1 is a perspective view of the lateral resonant tunneling transistor according to the present invention;

Referring to FIG. 1, the resonant tunneling transistor according to the present invention includes: a GaAs buffer layer 12 as a first semiconductor layer formed upon an insulating GaAs substrate 10; an AlGaAs layer 14 as a second semiconductor layer formed thereupon without doping silicon; an AlGaAs layer 16 with silicon doped and formed thereupon; two portions of a cap layer 19 mutually facing to each other, and formed at the boundaries of a recess; two electrodes 20 each formed on the GaAs cap layer 19; and split gate electrodes 2, 4, 6, a and b formed mutually isolated upon the AlGaAs layer 16 at certain intervals.

The lateral resonant tunneling transistor of the present invention constituted as described above includes a 2-dimensional electron gas layer 13 which is formed in a hetero-joining portion between the GaAs buffer layer 12 and the AlGaAs layer 14 with no silicon doped, as shown in FIG. 1.

Figure 2A:
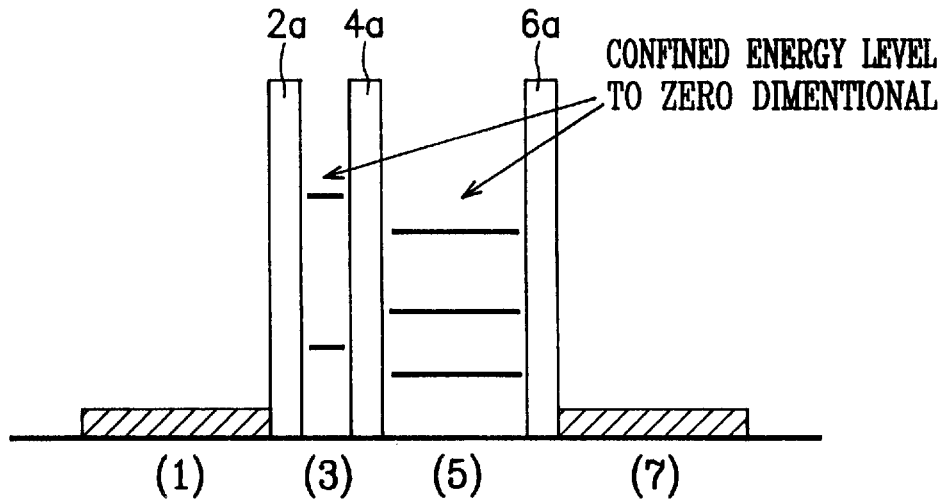
FIG. 2A illustrates the energy level in equlibrium state of the resonant tunneling transistor according to the present invention when a negative voltage is supplied to all gates.

As shown in FIG. 2A, the region of the device is divided into four portions by utilizing negatively biased gate potential barriers 2a, 4a and 6a.

In order to form two middle portions 3 and 5 into quantum dot structures, a negative voltage is supplied to the gates a and b. Then electrons move 2-dimensionally in one portion 1, while, in the middle quantum dot portion 3, electrons are confined to zero dimension.

Further, the gates 2, 4 and 6 are separated into tiny structures, so that electrons can easily be tunneled toward the quantum dots of the respective terminals and through the quantum dots.

Under this condition, in order to confine the electrons to a zero dimension in the portion 3, a negative voltage is supplied to the split gates 2 and 4 and to the gate a. Under this condition, the size of the quantum dot which is formed by the gates corresponds to the Fermi wave length of electrons.

The form in which electrons perform 0-dimensional movements is called quantum dot. In the energy level of electrons in the 0-dimensional quantum dot structure, the kinetic energies of electrons are quantized due to the quantum size effect as shown in FIG. 2A.

Further, in the region of the middle portion 5 also, the movements of electrons are confined to 0-dimensional quantum dot structure due to the negative voltage of the split gate b and the split gates 4 and 6. The distance between the potential barriers 4a and 6a is made longer by several times than the distance between the potential barriers 2a and 4a. The potential barriers 2a, 4a, and 6a are formed by the negatively biased gates 2, 4, and 6.

In this manner, in the portion 5 like in the portion 3, the kinetic energies of electrons are quantized as shown in FIG. 2A, but the intervals between the energy levels are made to be smaller than those of the middle portion 3.

Further, by adjusting the respective gate voltages, the heights of the potential barriers 2a and 4a are made to be several times higher than that of the potential barrier 6a.

This is for increasing the usual tunneling current due to the small potential barrier 6a.

Further, terminals are formed in the two terminal portions 1 and 7 based on an ohmic contact.

The width and length of the quantum dot through which electrons pass are about 0.2 $\mu$m, and therefore, the length of the channel, i.e., the distance between the two terminals is less than 1 $\mu$m.

Further, the length of the respective gates in the direction of tunneling of electrons is several scores of nm.

Figure 3A:
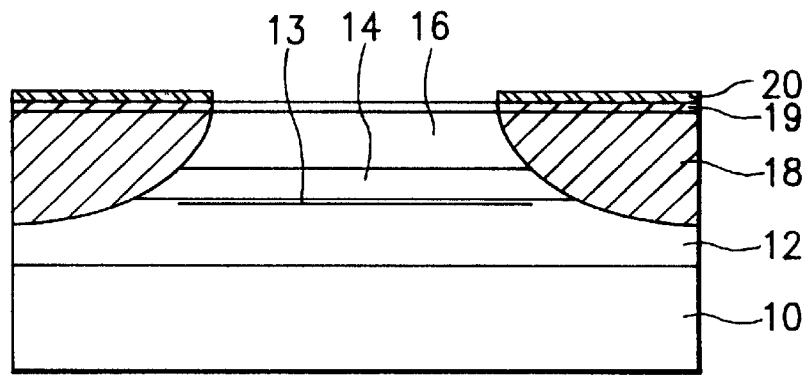
FIGS. 3A to 3C are sectional views showing the fabrication process for the lateral resonant tunneling transistor.
Figure 3B:
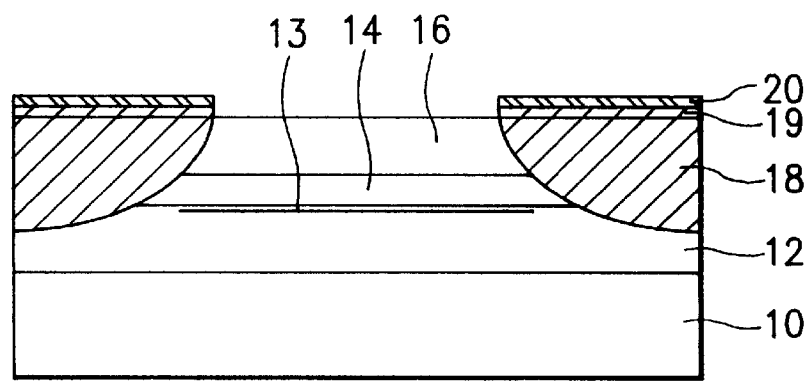
Figure 3C:
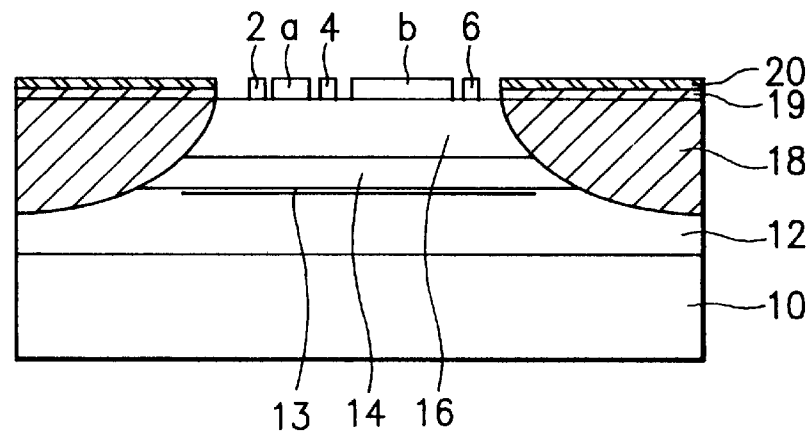

The lateral resonant tunneling diode according to the present invention as shown in FIG. 1 is manufactured as shown in FIGS. 3A to 3C.

Referring to FIG. 3A, a GaAs buffer layer 12, an undoped AlGaAs layer 14 and an Si doped AlGaAs layer 16 are stacked in the mentioned sequence upon a semi-insulating GaAs substrate 10 by using MBE or MOCVD method. Thus a 2-dimensional electron gas layer 13 of AlGaAs is formed so as to use it as a basic substrate for this device. Then in order to define a device formation region, the GaAs cap layer 19 is etched down to a certain depth by applying the photolithography, in such a manner that the etched region should have certain area. Thus there is formed an opening in which many gates are to be formed.

Then an Au/Ge (88/12) alloy, Ni and Au are sequentially deposited on a GaAs cap layer 19 by using a thermal metallization method. Then a lift-off method is carried out to leave the ohmic metal (so as to form an electrode 20) only on the GaAs cap layer 19 which is the two terminal portion. On this test piece, an RTA (rapid thermal annealing) is carried out at a temperature of 420° C. for 30 seconds under a nitrogen atmosphere.

Then as shown in FIG. 3C, applying a lithography process, wide width split gate patterns a and b are formed between the three narrow width split gate patterns, e.g., between the split gates 2 and 4, and between the split gates 4 and Al or Ti/Au is deposited upon the Si doped AlGaAs layer 16 by using a thermal metallization method.

Thus the above described split gates are arranged in the following manner. That is, a first row of parallelly disposed and mutually isolated split gates 2, 4, 6, a and b faces (with a certain gap) with a second row of split gates 2, 4, 6, a and b having the same constitution as that of the first row. The split gates consists of: a plurality of mutually isolated three split gates 2, 4 and 6; and two gates a and b formed between the split gates and having a wide width.

The resonant tunneling transistor of the present invention constituted as above will now be described as to its operating principles.

Figure 2B:
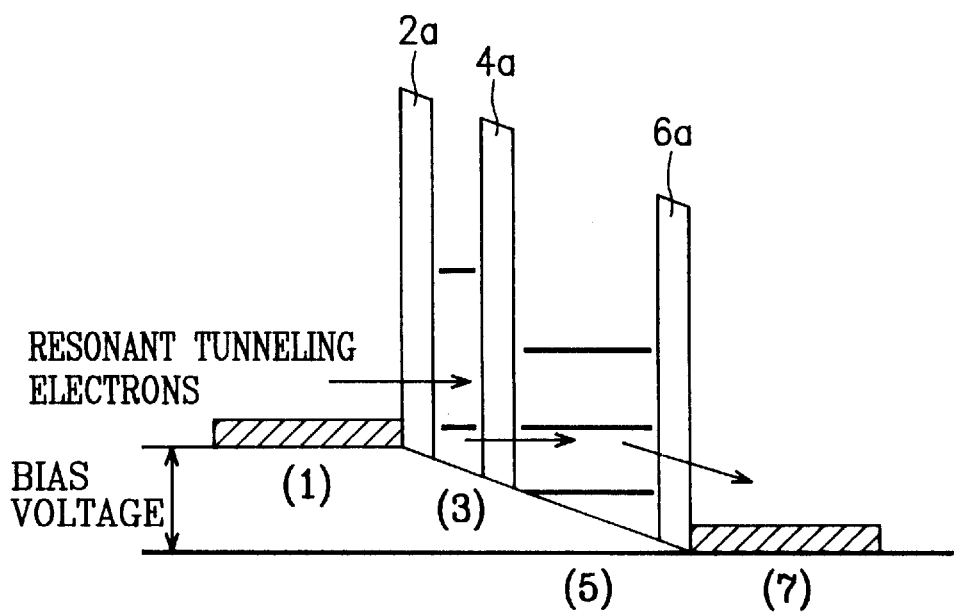
FIG. 2B illustrates the energy level when a negative voltage is supplied to all the split gates and a voltage is supplied between two terminals of the resonant tunneling transistor according to the present invention.

Under a thermal equilibrium state, the state energy level is as shown in FIG. 2A, while an energy level which is varied by a forward both-terminal bias voltage is as shown in FIG. 2B.

As shown in FIG. 2B, if a forward bias voltage is applied to the two electrodes 20, the energy level of electrons in regional is gradually stepped up.

Under this condition, the energy levels of the both sides become to be corresponded across the potential barrier at a certain bias voltage, so that the electrons would be resonantly tunneled.

Under this condition, the flowing amount of electrons which flow from the 2-dimensional portion 1 to the first middle portion 3 is increased.

Further, the intervals of the energy levels are small in the second middle portion 5, and therefore, the both energy levels easily correspond at the first middle portion 3 and the second middle portion 5 with the certain bias voltage as shown in FIG. 2B.

Therefore, a large amount of electrons, which have flowed to the first middle portion 3 owing to the resonant tunneling phenomenon, flow again to the second middle portion 5 owing to the resonant tunneling phenomenon occurring between the first middle portion 3 and the second middle portion 5.

Further, due to a low potential barrier 6a, a large amount of electrons which have flowed owing to the two times of the resonant tunneling phenomenon are tunneled to the terminal portion 7.

Further, if the forward bias voltage is increased, the energy level of the 2-dimensional portion 1 is further stepped up, with the result that it does not correspond with the 0-dimensional energy level of the first middle portion 3, and that the resonant tunneling effect disappears.

Figure 4:
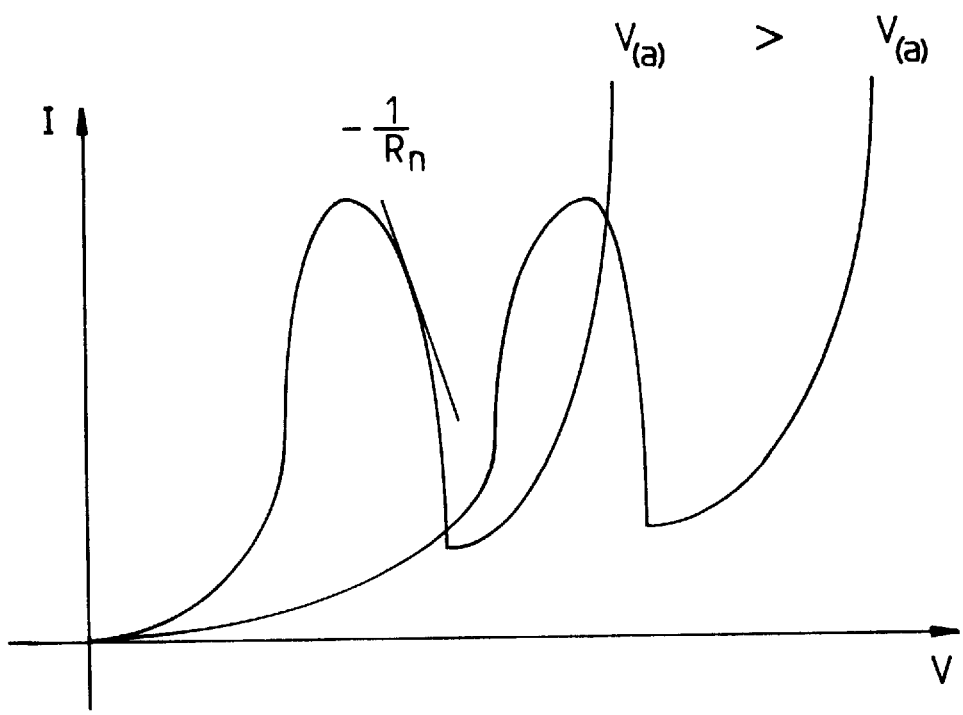
FIG. 4 is a graphical illustration showing the current-voltage characteristics between two terminals versus the variation of the gate voltages of the resonant tunneling transistor according to the present invention.

In this case, the amount of the current between the electrodes of the both terminals is drastically decreased to show the current-voltage characteristics having a negative differential resistance (−1/Rn), as shown in FIG. 4.

Here, the negative differential resistance is an inverted value of the variation rate of the current caused by the bias voltage V between the both terminals. That is, it is an inverted value of the slope of the current-voltage characteristic curve of FIG. 4, and it appears in the terminal bias voltage after the peak value of the resonant tunneling current.

Further, the higher the value of the slope, the greater the variation of the negative differential resistance. Therefore it shows an improved characteristic when the transistor of the present invention is applied to a switching device, a radio frequency oscillating device, and an amplifying device.

In the resonant tunneling transistor of the present invention, two resonant tunneling phenomena are successively utilized. The height of the third potential barrier 6a is adjusted to a low level, so that a large amount of resonant tunneling electrons can be made to flow to the terminal region 7. Accordingly, in the current-voltage characteristics, a large negative differential resistance is shown.

Further, quantum dots are utilized in the first and second middle portions 3 and 5 through which electrons flow. The magnitudes of these quantum dots are adjusted by means of the voltages of the gates a and b, so that the energy level can be varied. Thus based on the voltage variation of the gates a and b, diversified transistor characteristics can be obtained. For example, in a state with all the gate voltages fixed, the sizes of the quantum dots, i.e., the energy levels are varied in accordance with the variation of the voltage of the split gate a, thereby obtaining the variation of the current-voltage characteristics as shown in FIG. 4.

During the resonant tunneling of electrons, when the electrons are tunneled through the potential barriers 2a, 4a and 6a, the electrons lose their kinetic energies by collision with phonon, grain boundaries or other impurities.

Further, through such factors, the energy level in 0-dimension can be dispersed.

These factors gives influence to the magnitude of the current caused by the resonant tunneling effect, and therefore, these factors should be made diminished.

According to the present invention as described above, a negative voltage is applied to a plurality of thin split gates as shown in FIG. 2, so that two non-symmetric quantum dots are formed. Thus when a forward bias voltage is applied, the resonant tunneling phenomena occur twice successively. Through these two successive resonant tunneling phenomena and by lowering the height of the third potential barrier 6a, the resonant tunneling current can be maximized.

Further, the sizes of the quantum dots are adjusted by means of the voltages of the wide split gates, thereby obtaining various current-voltage characteristics.

The advantages which can be obtained through such materials and structure are as follows. That is, a high negative differential resistance can be obtained compared with the conventional method, and the gate voltages can be adjusted, with the result that the resonant tunneling current can be adjusted.

Further, the transistor of the present invention can be integrated with other semiconductor devices which have different characteristics.

What is claimed is:

1. A lateral resonant tunneling transistor having two unequal quantum dots, comprising:

a 2-dimensional electron gas layer formed by joining first and second semiconductor layers having mutually different materials;

a first row of split gates comprising a plurality of split gates arranged in parallel and isolated from one another;

a second row of split gates having the same constitution as said first row of split gates, and facing toward said first row of split gates; and said split gates comprising first split gates and second split gates, said first split gates having a narrow width with certain intervals between them, and said second split gates having a wider width and disposed between said first split gates, wherein two unequal quantum dots are formed between said split gates of said first row and said second row.

2. The lateral resonant tunneling transistor as claimed in claim 1, wherein said first and second semiconductor layers are respectively composed of AlGaAs and GaAs, and have two unequal quantum dots.

3. The lateral resonant tunneling transistor as claimed in claim 1, wherein said split gates are provided in a number of 3, and said gates are provided in a number of 2.

4. The lateral resonant tunneling transistor as claimed in claim 1, wherein said split gates form narrow-intervaled first middle portions, and wide-intervaled second middle portions.

5. The lateral resonant tunneling transistor as claimed in claim 1, wherein said gates respectively have narrow lengths and wide lengths.

6. A lateral resonant tunneling transistor having two unequal quantum dots, comprising:

a first row of split gates comprising a plurality of split gates arranged in parallel and being isolated from one another;

a second row of split gates comprising a plurality of split gates arranged in parallel and isolated from one another, said second row of split gates being arranged to face said first row of split gates; and wherein said split gates comprise first split gates and second split gates, said first split gates having a first width with predetermined intervals between said first split gates and said second split gates having a second width and being disposed between the first split gates, wherein two unequal quantum dots are formed between the split gates of the first and second row of split gates.

7. The lateral resonant tunneling transistor as claimed in claim 6, wherein said first width is less than said second width.

8. The lateral resonant tunneling transistor as claimed in claim 6, further comprising a two dimensional electron gas layer formed by joining first and second semiconductor layers having mutually different materials.

9. The lateral resonant tunneling transistor as claimed in claim 8, wherein said first layer comprises AlGaAs and said second layer comprises GaAs.

* * * * *